(12) United States Patent
Jeong et al.

(10) Patent No.: US 7,619,701 B2
(45) Date of Patent: Nov. 17, 2009

(54) DISPLAY DEVICE AND MANUFACTURING METHOD THEREOF

(75) Inventors: Seung Man Jeong, Gunpo-si (KR); Woo Seock Lee, Seoul (KR); Tae Hoon Ku, Goyang-si (KR)

(73) Assignee: LG Innotek Co., Ltd., Seoul (KR)

( * ) Notice: Subject to any disclaimer, the term of this patent is extended or adjusted under 35 U.S.C. 154(b) by 66 days.

(21) Appl. No.: 11/913,293

(22) PCT Filed: Aug. 11, 2006

(86) PCT No.: PCT/KR2006/003150

§ 371 (c)(1),
(2), (4) Date: Oct. 31, 2007

(87) PCT Pub. No.: WO2007/018413

PCT Pub. Date: Feb. 15, 2007

(65) Prior Publication Data

US 2008/0192415 A1   Aug. 14, 2008

(30) Foreign Application Priority Data

Aug. 11, 2005   (KR) .................. 10-2005-0073747

(51) Int. Cl.
*G02F 1/1333* (2006.01)
*H01J 9/00* (2006.01)
*G06F 1/16* (2006.01)
(52) U.S. Cl. ..................... 349/58; 361/681; 445/24
(58) Field of Classification Search .............. 349/58; 361/681; 445/24
See application file for complete search history.

(56) References Cited

U.S. PATENT DOCUMENTS

| | | | | |
|---|---|---|---|---|
| 6,906,705 B2* | 6/2005 | Matsuo et al. | ............... | 345/206 |
| 7,289,627 B2* | 10/2007 | Satoh et al. | ............ | 379/433.13 |
| 7,453,700 B2* | 11/2008 | Miyata | ....................... | 361/749 |
| 2004/0021616 A1 | 2/2004 | Goto et al. | | |
| 2004/0189926 A1 | 9/2004 | Yamaji et al. | | |
| 2005/0151918 A1* | 7/2005 | Park et al. | .................... | 349/150 |

FOREIGN PATENT DOCUMENTS

| | | |
|---|---|---|
| CN | 1591558 A | 3/2005 |
| JP | 2003-302621 A | 10/2003 |
| JP | 2003287748 A | 10/2003 |
| JP | 2004-088263 A | 3/2004 |
| JP | 2005-070121 A | 3/2005 |
| JP | 2005-072114 A | 3/2005 |
| JP | 2005-123544 A | 5/2005 |
| JP | 2005-136877 A | 5/2005 |
| KR | 102001068264 A | 7/2001 |

* cited by examiner

*Primary Examiner*—Mike Qi
(74) *Attorney, Agent, or Firm*—Saliwanchik, Lloyd & Saliwanchik

(57) ABSTRACT

Provided are a display device and a manufacturing method thereof. The display device includes a first display unit, a first interface unit, a second display unit, and a main board. The first display unit displays an image and is connected to a first interface unit. The second display unit displays an image and includes a second connecting unit formed thereon. The main board includes a third connecting unit connected to the second connecting unit, and a fourth connecting unit connected to the first interface unit.

20 Claims, 6 Drawing Sheets

[Fig. 1]
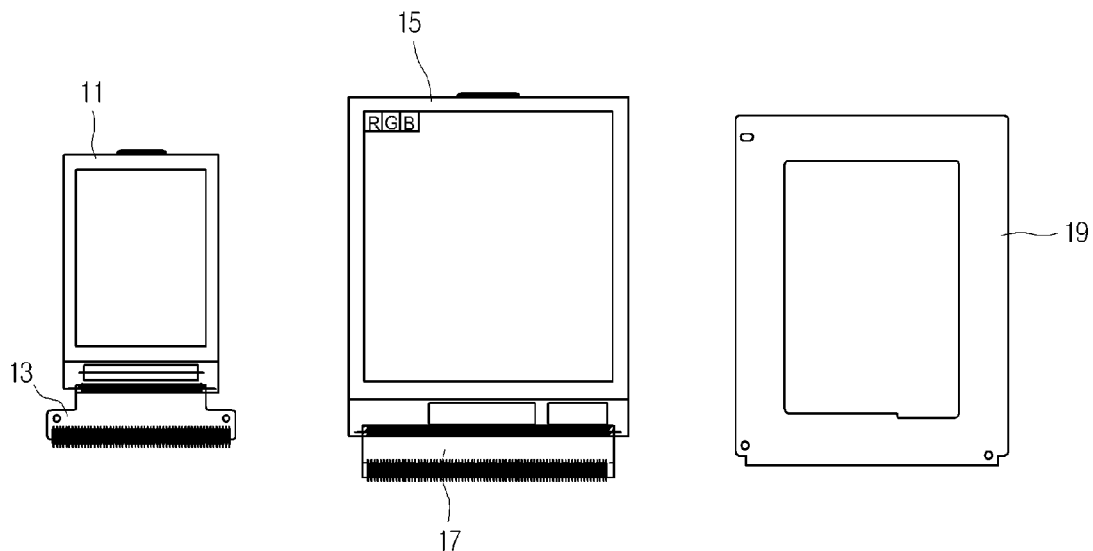
[Fig. 2]
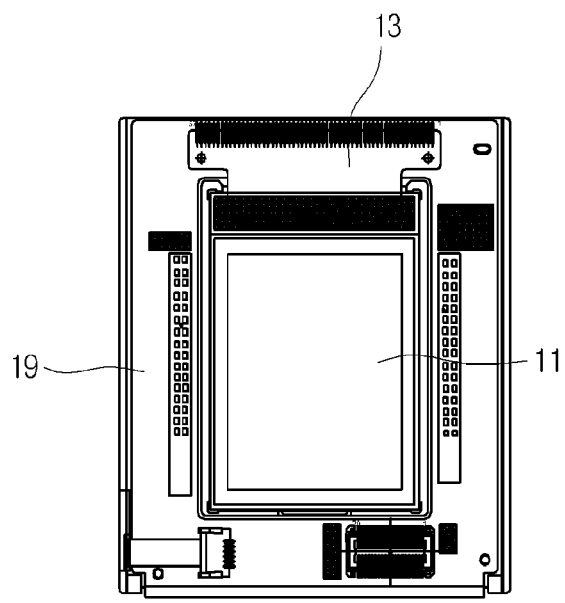

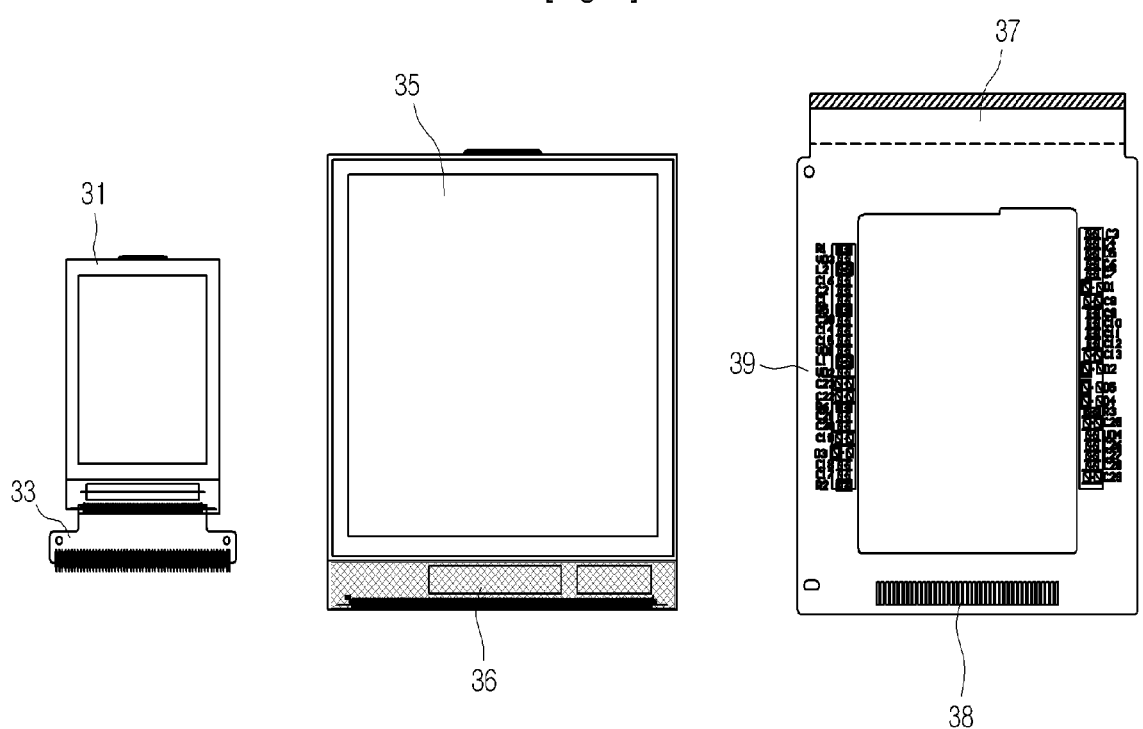

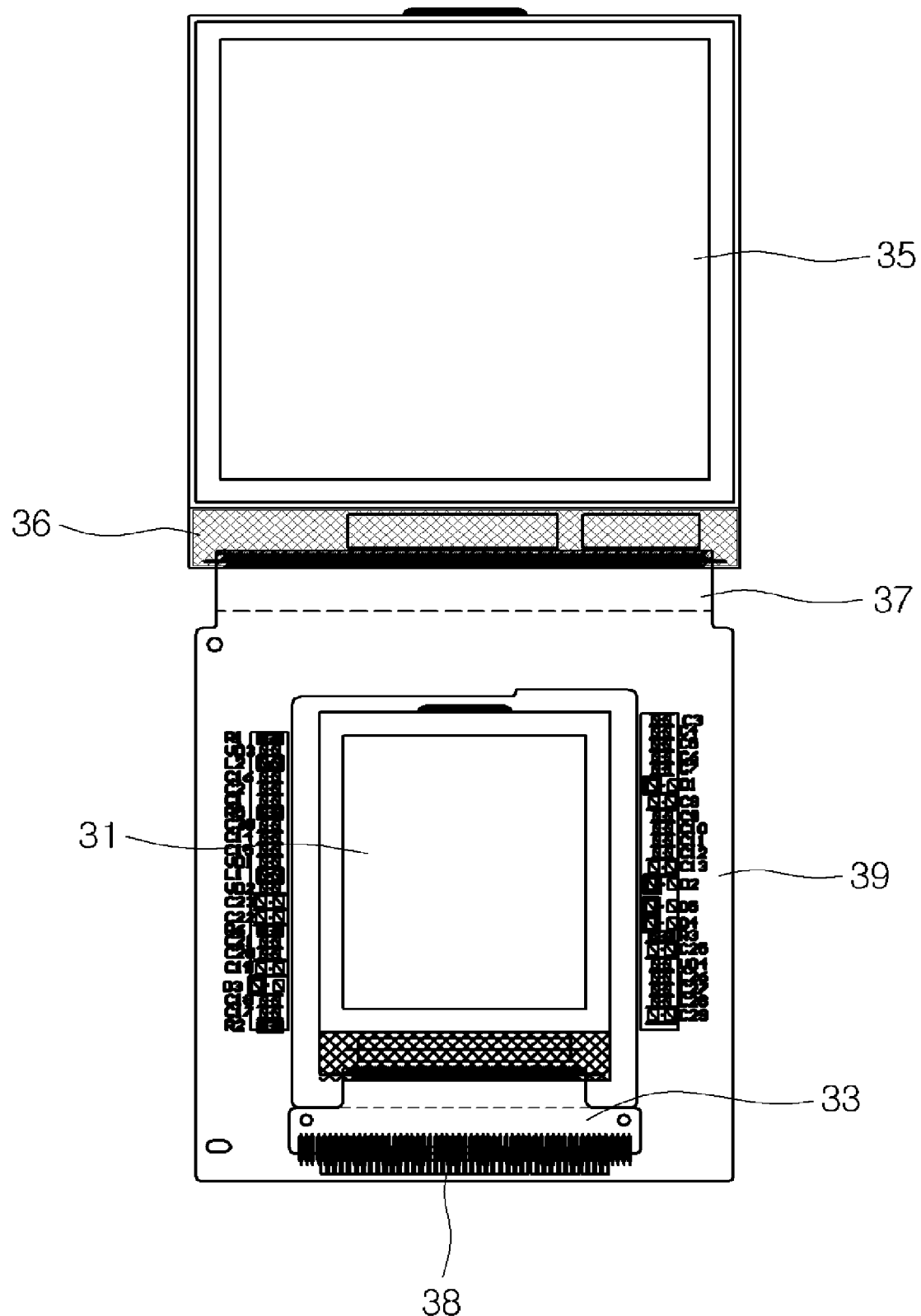
[Fig. 4]

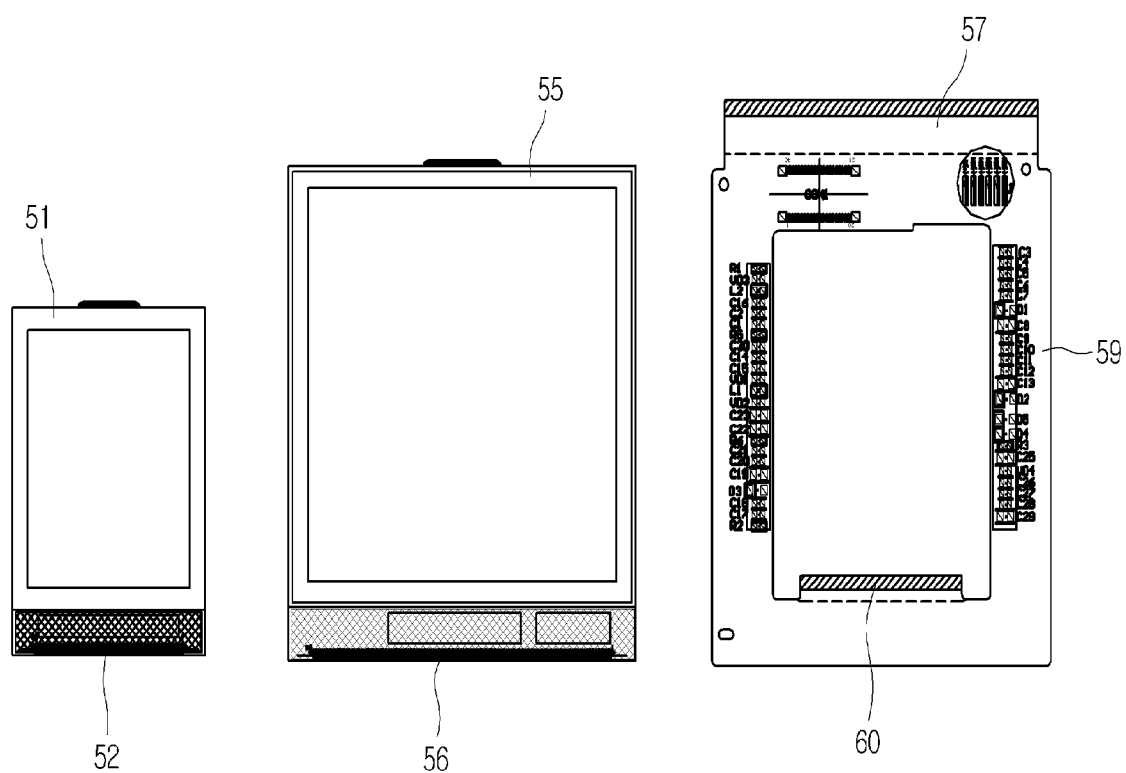
[Fig. 5]

[Fig. 6]
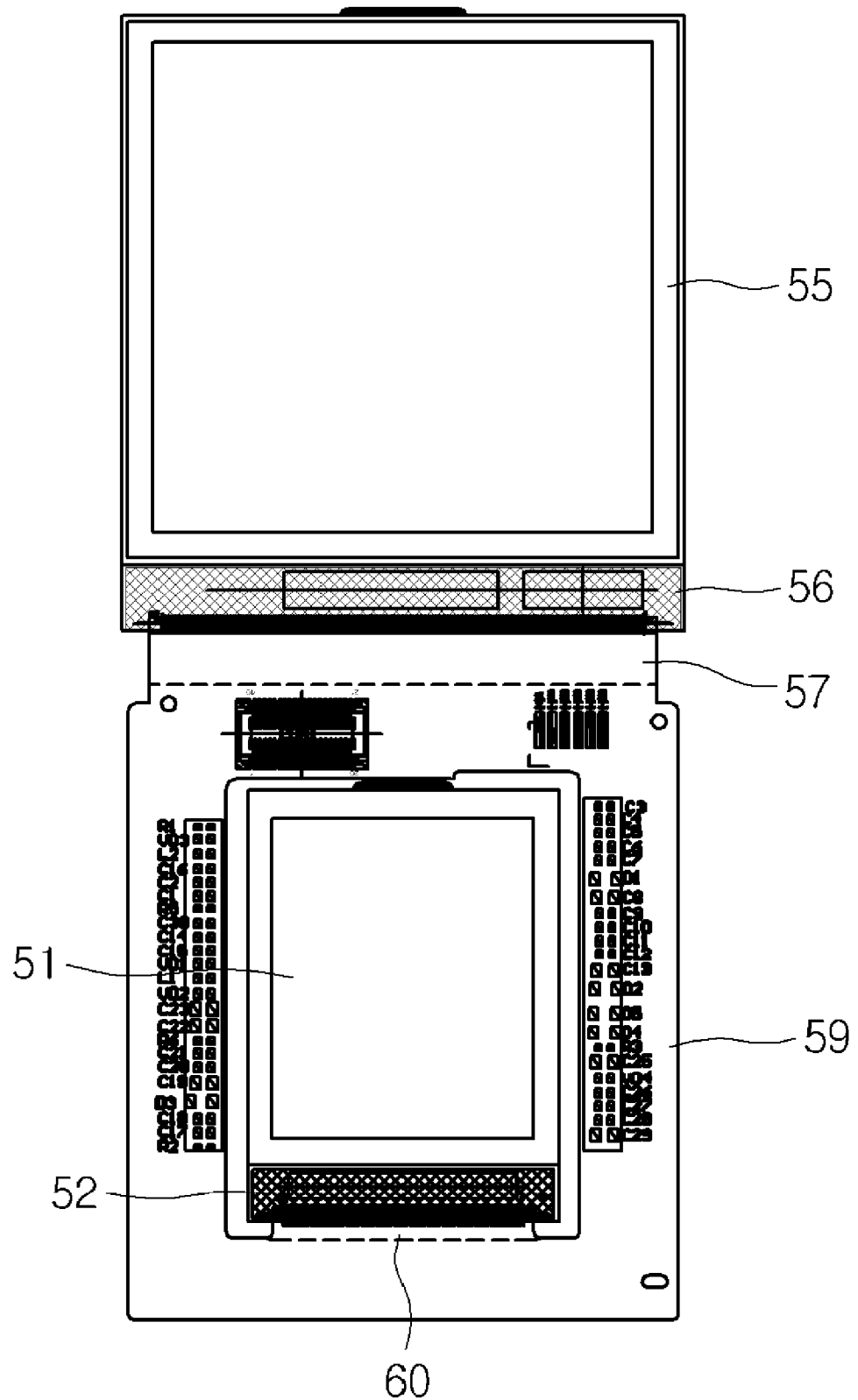

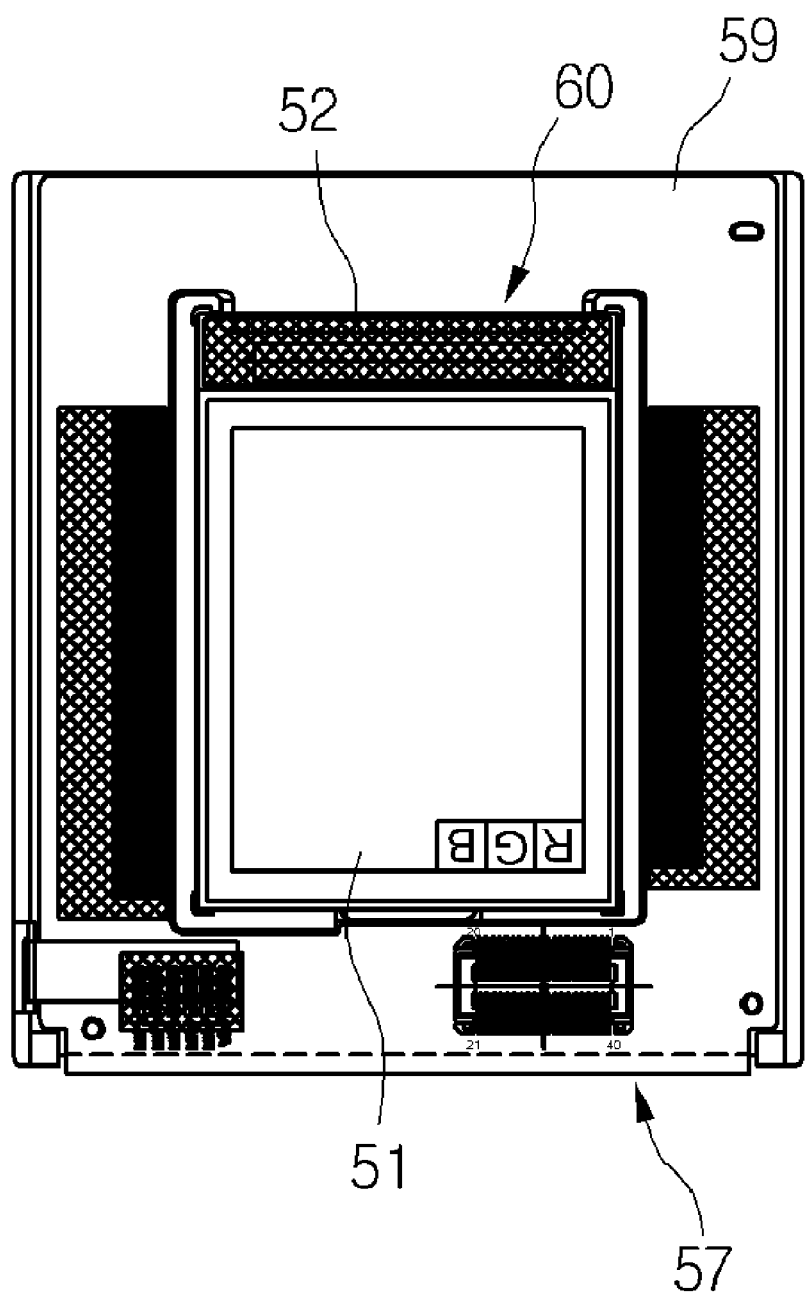
[Fig. 7]

DISPLAY DEVICE AND MANUFACTURING METHOD THEREOF

CROSS-REFERENCE TO RELATED APPLICATION

This application is the U.S. national stage application of International Patent Application No. PCT/KR2006/003150, filed Aug. 11, 2006, the disclosure of which is hereby incorporated by reference in its entirety.

TECHNICAL FIELD

The present invention relates to a display device and a manufacturing method thereof.

BACKGROUND ART

Among display devices for displaying image information on a screen, a Braun tube display device (or, cathode ray tube(CRT)) has been most popularly used up to date. However, the CRT has several disadvantages that it is bulky and heavy in comparison with its display area.

Therefore, a thin, flat panel display device with a large display area that can be used anywhere has been developed and is gradually substituting for a cathode ray tube. Liquid crystal display devices (LCDs) are especially favored since they have a much higher resolution than other flat panel display devices and are also closer in response time to CRT display devices than other types of flat panel display devices.

Two representative display devices used on mobile communication terminals are LCDs and organic light emitting diodes (OLEDs). There is recently a growing trend for fitting mobile communication terminals with two display devices to display images in two directions. Here, one main board is connected to the two display devices. FIGS. 1 and 2 show the connecting structure between display devices and a main board, according to the related art. FIG. 1 is a schematic view of the structure of a display device according to the related art, and FIG. 2 is a plan view showing the connected state of a display device according to the related art.

A display device according to the related art includes a first display unit 11, a first interface unit 13, a second display unit 15, a second interface unit 17, and a main board 19.

In the above structure, a display device according to the related art is interconnected in the following way. First, the first display unit 11 and the first interface unit 13 are connected. Then, the second display unit 15 and the second interface unit 17 are respectively connected to each other. Subsequently, the first interface unit 13 and the main board 19 are connected, and the second interface unit 15 and the main board 19 are connected.

Here, the first display unit 11 and the second display unit 15 may be formed as an LCD device or an OLED device. Also, the main board 19 may be formed as a rigid printed circuit board (PCB) or a flexible printed circuit board (FPCB).

The first interface unit 13 is needed to connect the main board 19 with the first display unit 11. The second interface unit 17 is needed to connect the main board 19 with the second display unit 15. One end of the first interface unit 13 is connected to a pad unit formed on the first display unit 11, and the other end of the first interface unit 13 is connected to a pad unit formed on the main board 19. One end of the second interface unit 17 is connected to a pad unit formed on the second display unit 15, and the other end of the second interface unit 17 is connected to a pad unit formed on the main board 19.

Thus, the connecting structure in the related art does not allow a direct connection between the main board 19 and the first display unit 11 and the second display unit 15. A pad unit, for connecting to the first display unit 11 is formed at one end of the main board 19. At the other end of the main board 19, a pad unit for connecting to the second display unit 15 is formed. Each pad unit formed on the main board 19 is connected respectively to the first interface unit 13 and the second interface unit 17.

Accordingly, in order to connect the first display unit 11 and the second display unit 15 to the main board 19, the first interface unit 13 and the second interface unit 17 are additionally required, which increases cost. Also, added connecting processes for connecting the first interface unit 13 to the first display unit 11 and the second interface unit 17 to the second display unit 15 are needed, complicating manufacturing. The addition of these processes increases the number of manufacturing stages and the probability of defects.

DISCLOSURE OF INVENTION

Technical Problem

The present invention provides a display device and a manufacturing method thereof that simplifies the connecting of the main board to the first and the second display units, to reduce manufacturing processes and costs.

Technical Solution

The present invention provides a display device including: a first display unit for displaying an image; a first interface unit connected to the first display unit; a second display unit for displaying an image and including a second connecting unit formed thereon; and a main board including a third connecting unit connected to the second connecting unit, and a fourth connecting unit connected to the first interface unit.

The present invention provides a display device including: a first display unit for displaying an image and including a first connecting unit formed thereon; a second display unit for displaying an image and including a second connecting unit formed thereon; and a main board including a third connecting unit connected to the second connecting unit, and a fourth connecting unit connected to the first connecting unit.

The present invention provides a manufacturing method of a display device. The method includes: providing a first display unit, and a second display unit including a second connecting unit formed thereon; providing a main board including a third connecting unit and a fourth connecting unit formed thereon; connecting the first display unit to the first interface unit; connecting the first interface unit to the fourth connecting unit formed on the main board, and connecting the second connecting unit of the second display unit to the third connecting unit formed on the main board.

The present invention provides a manufacturing method of a display device. The method includes: providing a first display unit including a first connecting unit formed thereon, and a second display unit including a second connecting unit formed thereon; providing a main board including a third connecting unit and a fourth connecting unit formed thereon; and connecting the first connecting unit of the first display unit to the fourth connecting unit formed on the main board, and connecting the second connecting unit of the second display unit to the third connecting unit formed on the main board.

Advantageous Effects

An advantage of the display device and manufacturing method thereof according to the present invention is that they provide a simple connection between a main substrate and a first and a second display unit, to reduce manufacturing processes and costs.

BRIEF DESCRIPTION OF THE DRAWINGS

FIG. 1 is a schematic view of the structure of a display device according to the related art FIG. 2 is a plan view showing the connected state of a display device according to the related art.

FIG. 3 is a schematic plan view of the structure of a display device according to the present invention.

FIG. 4 is a plan view showing the connected state of a display device according to the present invention.

FIG. 5 is a schematic plan view of the structure of a display device according to another embodiment of the present invention.

FIG. 6 is a plan view showing the connected state of a display device according to another embodiment of the present invention.

FIG. 7 is a plan view showing the final assembled state of a display device according to another embodiment of the present invention.

MODE FOR THE INVENTION

Hereinafter, embodiments of a display device and a manufacturing method thereof according to the present invention will be described in detail with reference to the accompanying drawings.

FIG. 3 is a schematic plan view of the structure of a display device according to the present invention, and FIG. 4 is a plan view showing the connected state of a display device according to the present invention.

Referring to FIGS. 3 and 4, a display device according to the present invention includes a first display unit 31, a first interface unit 33, a second display unit 35 having a second connecting unit 36, a main board 39 having a third connecting unit 37 and a fourth connecting unit 38.

Here, the first display unit 31 and the second display unit 35 may be formed as LCDs or as as OLEDs. The main board 39 may be formed as a rigid PCB or an FPCB. The first interface unit 33 may be formed as an FPCB.

In the display device according to the present invention, the third connecting unit 37 and the fourth connecting unit 38 are integrally formed on the main board 39. The second display unit 35 has the second connecting unit 36 integrally formed thereon. To connect the first display unit 31 with the main board 39 in the display device according to the present invention, a first interface unit 33 is further included.

Here, the second connecting unit 36 formed on the second display unit 35 is connected directly to the third connecting unit 37 formed on the main board 39. The first interface unit 33 connects to the fourth connecting unit 38 formed on the main board 39, so that the main board 39 is connected to the first display unit 31.

When the main board 39 is formed of an FPCB, the main board 39 may be formed of a double layer or a multi layer of three or more layers.

When the main board 39 is a double layer, the third connecting unit 37 may form terminal pads at the bottom surface of the main board 39. The fourth connecting unit 38 may form terminal pads on the top surface of the main board 39.

When the main board 39 is a multi layer of three or more layers, the terminal pads of the third connecting unit 37 may be formed on the bottom surface of the main board 39, and a terminal layer located on an inner layer of the main board 39 may be used to form the terminal pads. The fourth connecting unit 38 may form terminal pads on the upper surface of the main board 39.

The above structured display device may be interconnected through following process.

First, the first display unit 31 and the second display unit 35 having the second connecting unit 36 are provided. Then, the main board 39, on which the third connecting unit 37 and the fourth connecting unit 38 are formed, is provided.

Next, the first interface unit 33 is connected to the first display unit 31. Then, the first interface unit 33 is connected to the fourth connecting unit 38 formed on the main board 39, and the second connecting unit 36 of the second display unit 35 is connected directly to the third connecting unit 37 formed on the main board 39. The third connecting unit 37 may be connected to the second connecting unit 36 with inserted.

The second connecting unit 36 formed on the second display unit 35 is connected directly to the third connecting unit 37 formed on the main board 39. Accordingly, in order to connect the main board 39 and the second display unit 35, a separate interface unit is not required. Thus, the number of components and manufacturing processes can be reduced, to reduce costs and the rate of defects.

FIG. 5 is a schematic plan view of the structure of a display device according to another embodiment of the present invention, FIG. 6 is a plan view showing the connected state of a display device according to another embodiment of the present invention, and FIG. 7 is a plan view showing the final assembled state of a display device according to another embodiment of the present invention.

Referring to FIGS. 5 through 7, a display device according to the present invention includes a first display unit 51 having a first connecting unit 52, a second display unit 55 having a second connecting unit 56, a main board 59 having a third connecting unit 57 and a fourth connecting unit 60.

Here, the first display unit 51 and the second display unit 55 may be formed as LCDs or OLEDs. The main board 59 may be a rigid PCB or an FPCB.

In the display device according to the present invention, the third connecting unit 57 and the fourth connecting unit 60 are integrally formed on the main board 59. The first connecting unit 52 is integrally formed on the first display unit 51. The second connecting unit is integrally formed on the second display unit 55.

Here, the second connecting unit 56 formed on the second display unit 55 is directly connected to the third connecting unit 57 formed on the main board 59. The third connecting unit 57 may be connected to the second connecting unit 56 with inserted. The first connecting unit 52 formed on the first display unit 51 is directly connected to the fourth connecting unit 60 formed on the main board 59. The fourth connecting unit 60 may be connected to the first connecting unit 52 with inserted.

When the main board 59 is formed of an FPBC, the main board 59 may be formed as a double layer or a multi layer of three or more layers.

When the main board 59 is formed as a double layer, terminal layer pads may be formed along the terminal pads of the panel. Normally, the third connecting unit 57 may form terminal pads at a bottom surface of the main board 59, and the fourth connecting unit 60 may form terminal pads at the bottom surface of the main board 59.

When the main board 59 is formed as a multi layer of three layers or more, the terminal pads of the third connecting unit 57 may be formed on either surfaces (top and bottom surfaces) of the main board 59 or on the bottom surface, and may use a terminal layer located at an inner layer of the main board 59 to form the terminal pads. The terminal pads of the fourth connecting unit 60 may be formed on the bottom surface of the main board 59 or formed using a terminal layer located at an inner layer of the main board 59.

The above structured display device is interconnected through the following process.

First, the first display unit 51 having the first connecting unit 52 and the second display unit 55 having the second connecting unit 56 are provided. Then, the main board 59 having the third connecting unit 57 and the fourth connecting unit 60 is provided.

Next, the first connecting unit 52 of the first display unit 51 is directly connected to the fourth connecting unit 60 formed on the main board 59, and the second connecting unit 56 of the second display unit 55 is directly connected to the third connecting unit 57 formed on the main board 59. The fourth connecting unit 60 may be connected to the first connecting unit 52 with inserted. The third connecting unit 57 may be connected to the second connecting unit 56 with inserted.

In the present invention, the second connecting unit 56 formed on the second display unit 55 is directly connected to the third connecting unit 57 formed on the main board 59, and the first connecting unit 52 formed on the first display unit 51 is directly connected to the fourth connecting unit 60 formed on the main board 59. Accordingly, a separate interface unit is not needed to connect the main board to the first display unit 51. Also, a separate interface unit is not needed to connect the main board 59 to the second display unit 55.

Therefore, the number of components and manufacturing processes are reduced, thereby reducing cost and the rate of defects.

Additionally, the above display device according to the present invention may be applied to a mobile communication terminal, and a variety of other electronic devices which display images on both sides thereof. In these cases, the display device according to the present invention does not need separate interface units to connect the main board to each display unit to form a product with a lower profile.

INDUSTRIAL APPLICABILITY

The display device and manufacturing method thereof according to the present invention provides simple connections between the main board and first and second display units, to reduce manufacturing processes and cost, for a high industrial applicability.

The invention claimed is:

1. A display device comprising:
a first display unit for displaying an image;
a first interface unit connected to the first display unit;
a second display unit for displaying an image and including a second connecting unit formed thereon; and
a main board including a third connecting unit connected to the second connecting unit, and a fourth connecting unit connected to the first interface unit.

2. The display device according to claim 1, wherein the main board is formed of an FPCB (flexible printed circuit board).

3. The display device according to claim 1, wherein the main board is formed in a double layer.

4. The display device according to claim 3, wherein at least the third connecting unit is formed on a bottom surface of the main board.

5. The display device according to claim 1, wherein the main board is formed in a multi layer of three or more layers.

6. The display device according to claim 5, wherein at least the third connecting unit is formed on a bottom surface or an inner layer of the main board.

7. The display device according to claim 1, wherein the fourth connecting unit is formed on a top surface of the main board.

8. The display device according to claim 1, wherein the first display unit and/or the second display unit is an LCD (liquid crystal display device) or an OLED (organic light emitting diode).

9. A display device comprising:
a first display unit for displaying an image and including a first connecting unit formed thereon;
a second display unit for displaying an image and including a second connecting unit formed thereon; and
a main board including a third connecting unit connected to the second connecting unit, and a fourth connecting unit connected to the first connecting unit.

10. The display device according to claim 9, wherein the main board is formed of an FPCB (flexible printed circuit board).

11. The display device according to claim 9, wherein the main board is formed as a double layer.

12. The display device according to claim 11, wherein at least one of the third and fourth connecting units is formed at a bottom surface of the main board.

13. The display device according to claim 9, wherein the main board is formed in a multi layer of three or more layers.

14. The display device according to claim 13, wherein at least one of the third and fourth connecting units is formed on a bottom surface or an inner layer of the main board.

15. A manufacturing method of a display device, comprising:
providing a first display unit, a first interface unit, and a second display unit including a second connecting unit formed thereon;
providing a main board including a third connecting unit and a fourth connecting unit formed thereon;
connecting the first display unit to the first interface unit;
connecting the first interface unit to the fourth connecting unit formed on the main board, and connecting the second connecting unit of the second display unit to the third connecting unit formed on the main board.

16. The manufacturing method according to claim 15, wherein the main board is formed of an FPCB (flexible printed circuit board).

17. The manufacturing method according to claim 15, wherein the main board is formed in two or more layers.

18. A manufacturing method of a display device, comprising:
providing a first display unit including a first connecting unit formed thereon, and a second display unit including a second connecting unit formed thereon;
providing a main board including a third connecting unit and a fourth connecting unit formed thereon; and
connecting the first connecting unit of the first display unit to the fourth connecting unit formed on the main board, and connecting the second connecting unit of the second display unit to the third connecting unit formed on the main board.

19. The manufacturing method according to claim 18, wherein the main board is formed of an FPCB (flexible printed circuit board).

20. The manufacturing method according to claim 18, wherein the main board is formed in two or more layers.

* * * * *